United States Patent

Lumsden et al.

Patent Number: 5,481,225
Date of Patent: Jan. 2, 1996

[54] VARIABLE GAIN DIFFERENTIAL AMPLIFIER CIRCUIT

[75] Inventors: John Lumsden; Alan Flum, both of Boca Raton, Fla.

[73] Assignee: Sony Electronics Inc., Park Ridge, N.J.

[21] Appl. No.: 253,652

[22] Filed: Jun. 3, 1994

[51] Int. Cl.⁶ ...................................................... H03F 3/45
[52] U.S. Cl. ............................................ 330/254; 330/292
[58] Field of Search .............................. 330/69, 252, 254, 330/258, 260, 292, 293

[56] References Cited

U.S. PATENT DOCUMENTS 3,832,646  8/1974  Szabo et al. ........................ 330/260 X
4,206,416  6/1980  Kellogg ..................................... 330/69

OTHER PUBLICATIONS

*An Introduction To Operational Amplifiers,* 2nd ed., Luces M. Faulkenberry, Texas State Tech. Instit., John Wiley & Sons, 1977/82, pp. 390 & 391.

*Operational Amplifier Characteristics & Applications,* 2nd ed., Robert G. Irvine, California State Poly. Univ., Pomona, Prentice Hall, Inc., Englewood Cliffs, N.J., 1981, pp. 144/5/6.

*Primary Examiner*—Steven Mottola
*Attorney, Agent, or Firm*—Jerry A. Miller

[57] ABSTRACT

A variable gain differential amplifier using a single operational amplifier. A potentiometer is used in the negative feedback loop with one end connected to ground through a resistor which limits the maximum gain. The other end is connected to the output and the wiper is connected through a minimum gain limiting resistor to the inverting terminal. This provides an amplifier with good CMRR, relatively low input impedance, wide gain control and variability with a single operational amplifier.

16 Claims, 3 Drawing Sheets

VARIABLE GAIN DIFFERENTIAL AMPLIFIER CIRCUIT

BACKGROUND

1. Field of the Invention

This invention relates generally to the field of differential amplifiers. More particularly, this invention relates to a differential amplifier circuit and has variable gain.

2. Background of the Invention

Professional audio equipment frequently utilizes differential line input stages. Differential amplifiers used in these applications frequently require a wide range (e.g. 30 db) of variable gain with an acceptably low input impedance (for good noise performance) and an acceptably high value of common mode rejection (e.g. >35 db). FIG. 1 illustrates a conventional design for such an amplifier stage.

In FIG. 1, input signals $V_A$ and $V_B$ are applied to resistors 10 and 12 respectively which are connected to the inverting and non-inverting inputs of an operational amplifier 16. A fixed amount of differential gain is provided according to the values of resistors 10 and 12 in cooperation with resistor 20 and feedback resistor 22 in a known manner. The fixed input stage of amplification provided by amplifier 16 permits the designer to design the circuit for suitably low impedance and high common mode rejection. The output of amplifier 16 is provided to a single ended gain stage through a resistive divider made up of resistors 26 and 30 to the non-inverting input of a second amplifier 34. Negative feedback is provided through resistor 38 to the inverting input of amplifier 34. The gain of amplifier 34 is adjustable via a potentiometer 40 which is in series with a resistor 42 and connected between the inverting input of amplifier 34 and ground. The value of resistor 42 limits the maximum gain of amplifier 34 to a predetermined value. The sum of resistor 42 and the full value of potentiometer 40 establish the minimum gain of amplifier 34.

The circuit of FIG. 1, and similar circuits which use multiple operational amplifiers (often three or more are used) provide very high performance and maximum control of all parameters associated with the differential amplifier. However, it is often desirable to reduce the number of amplifier stages and associated components in order to increase reliability, reduce size and reduce cost. Several circuits have been proposed to accomplish this purpose. The circuit of FIG. 2, for example, uses a single operational amplifier 50 as an input stage and variable gain stage. Voltage inputs $V_A$ and $V_B$ are provided to resistors 60 and 64 which are respectively coupled to the inverting and non-inverting inputs of amplifier 50. The gain of this arrangement is established by a network of 5 resistors. 66, 68, 70, 72 and 74 along with a potentiometer 78. Negative feedback is ultimately provided through resistor 66 while positive feedback is provided through resistor 72. Due to the presence of positive feedback, the circuit of FIG. 2 has the potential of instability which cannot be tolerated in some high performance audio applications.

Another single amplifier arrangement is shown in FIG. 3 with $V_A$ and $V_B$ again provided through resistors 80 and 82 to the inverting and non-inverting inputs of amplifier 86. Negative feedback is provided through a pair of feedback resistors 90 and 92 with a potentiometer 94 in series with a resistor 96 connecting the junction of resistors 90 and 92 to ground. Resistor 98 connects between the non-inverting input and ground. This circuit meets many of the needs outlined above except that the input impedance of the circuit must be relatively high in order to achieve a minimum gain value in the range of −10 db.

Another common circuit for providing a single amplifier variable differential amplifier is shown in FIG. 4. In this circuit signals $V_A$ and $V_B$ are provided through resistors 102 and 104 to the inverting and non-inverting input terminals of amplifier 108. The non-inverting terminal is also connected through resistor 110 to ground. A potentiometer 114 is connected from output to inverting input to provide variable negative feedback. While this circuit is simple in design and has a stable input impedance, the common mode rejection ratio (CMRR) varies widely with the gain selected by adjustment of potentiometer 114. In many cases the CMRR can become extremely low (e.g. less than 10 db) which can contribute to audible noise in an audio environment.

Accordingly, it is desirable to provide a differential amplifier which overcomes the shortcomings of the circuits of FIGS. 1 through 4.

SUMMARY OF THE INVENTION

It is an object of the present invention to provide a variable gain differential amplifier which utilizes a single operational amplifier.

It is an advantage that the circuit of the present invention has relatively low input impedance with good common mode rejection, wide range of gain and has a low part count and low cost.

These and other objects, advantages and features of the invention will become apparent to those skilled in the art upon consideration of the following description of the invention.

The present invention provides a variable gain differential amplifier using a single operational amplifier. A potentiometer is used in the negative feedback loop with one end connected to ground through a resistor which limits the maximum gain. The other end is connected to the output and the wiper is connected through a minimum gain limiting resistor to the inverting terminal. This provides an amplifier with good CMRR, relatively low input impedance, wide gain control and variability with a single operational amplifier.

In one embodiment of the present invention, a differential amplifier circuit with variable gain, includes an operational amplifier having an inverting input, a noninverting input and an output. A pair of input resistors $R_I$ and $R_1$ each having a first terminal respectively is connected to the inverting input and the non-inverting input, and each having a second terminal for receiving a differential input signal. A resistor $R_2$ is connected from the non-inverting terminal to a point of AC ground. A potentiometer having a wiper, a first end and a second end, the second end connected to the output is provided with a resistor $R_M$ connected between the first end of the potentiometer and the output. A resistor $R_F$ is connected between the wiper of the potentiometer and the inverting terminal of the operational amplifier. Preferably, a resistor $R_X$ is connected from the wiper to the output.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE INVENTION

Figure 1:
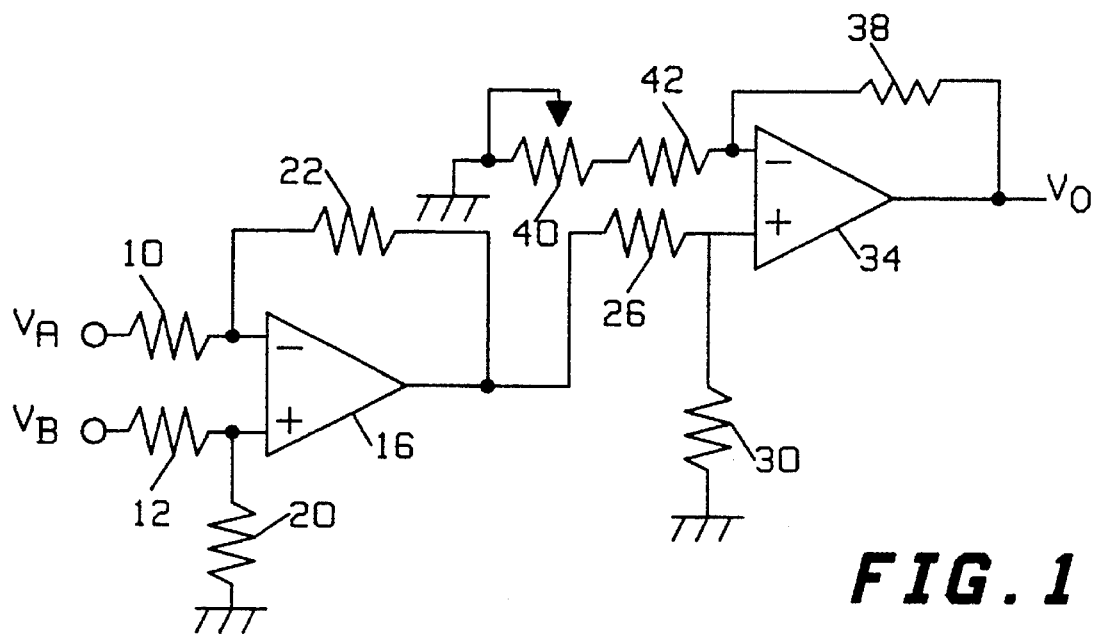
FIG. 1 is a schematic of a conventional two amplifier differential input amplifier with variable gain.
Figure 2:
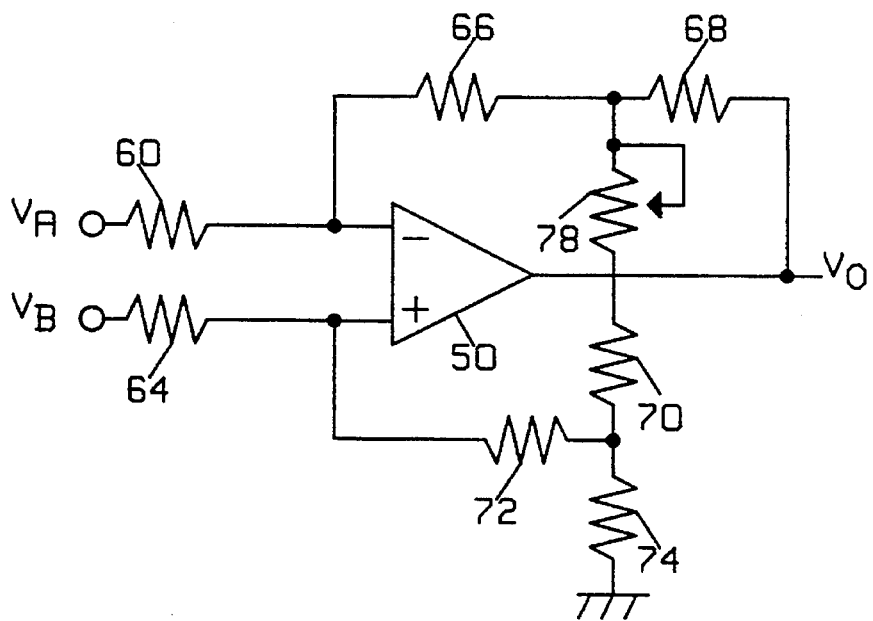
FIG. 2 is a schematic of a single operational amplifier circuit requiring positive feedback.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawing.

Figure 5:
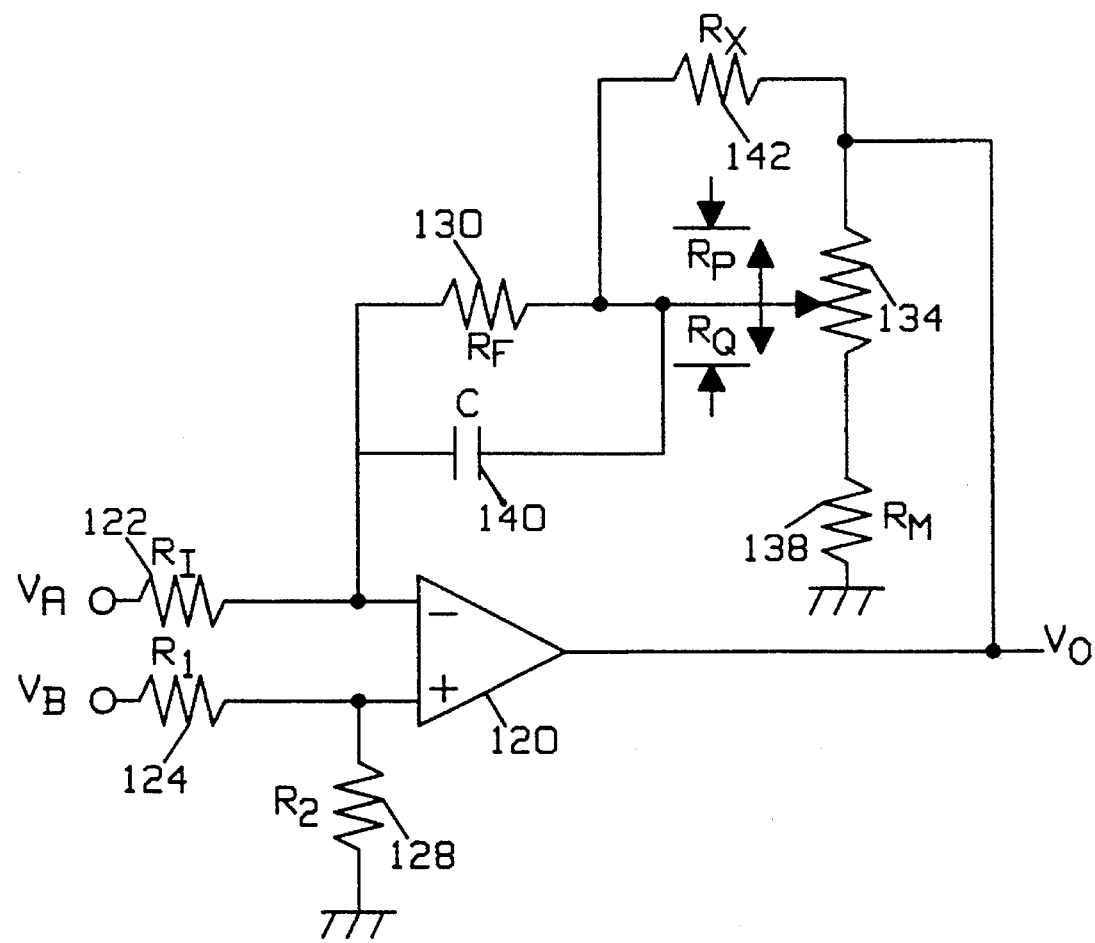
FIG. 5 is a schematic of a differential input variable gain amplifier of the present invention.

Turning now to FIG. 5, an amplifier circuit according to the present invention is shown. In this circuit input voltages $V_A$ and $V_B$ are coupled to the inverting and non-inverting inputs of an operational amplifier 120 via resistors 122 and 124. Resistor 122 is referred to as $R_I$ in the equations to follow while resistor 124 is referred to as $R_1$ in the equations to follow. Resistor 128 ($R_2$ in the equations) is connected between the non-inverting input of amplifier 120 and AC ground. A feedback resistor 130 is connected to the wiper of a potentiometer 134 with one end of potentiometer 134 connected to the output of amplifier 120 and the other end of potentiometer 134 connected through a resistor 138 to ground. A capacitor 140 is connected in parallel with resistor 130 in the preferred embodiment to provide variable feedback compensation for enhanced stability. In one embodiment of the present invention a resistor 142 is also connected between the wiper of potentiometer 134 and the output of the operational amplifier. In the equations that follow, resistor 130 is referred to as $R_F$, resistor 138 is referred to as $R_M$ and resistor 142 is referred to as resistor $R_X$. Two components of the potentiometer resistance are referred to in the equations as $R_P$ and $R_Q$. $R_P$ represents the value of the potentiometer between the amplifier output and the wiper and the $R_Q$ represents the value of the potentiometer between the wiper and resistor 138. Of course, those skilled in the art will understand that the circuit of FIG. 5 does not show power supplies, biasing, temperature or frequency compensation and any capacitive coupling that may be used.

Resistor 142 is selected, if desired, to be a very large value compared with the value of potentiometer 134 and is used to compensate for the possibility of the potentiometer wiper leaving contact with the wiper surface during adjustment. In the preferred embodiment, resistor 130 is also selected to be much larger than the potentiometer value. The term "much larger" is used in the conventional engineering sense to mean that the value is large enough so as not to significantly affect the calculations of interest. Typically, this means that a factor of at least 5 to 10 in magnitude is adequate to constitute "much larger." In addition, the following constraints are imposed on the circuit values of the preferred embodiment:

$$\frac{R_F}{R_I} = \frac{R_2}{R_1}$$

-continued $$R_F \gg R_P,$$

$$R_X \gg (R_P + R_Q)$$

With these assumptions (and standard Op-Amp analysis approximations) in place, the voltage at the output of the circuit $V_O$ is given by:

$$V_O \simeq \frac{R_F}{R_I} \left( 1 + \frac{R_P}{(R_Q + R_M)} \right) [V_A - V_b]$$

Thus, the minimum is gain $A_{Vmin}$ is established by selecting $R_F$. The minimum gain occurs when the potentiometer is adjusted so that $R_P=0$ and is given by:

$$A_{Vmin} = \frac{R_F}{R_I}$$

while the maximum gain is limited by $R_M$ and occurs when the potentiometer is adjusted so that $R_Q=0$ and is given by:

$$A_{Vmax} = \frac{R_F}{R_I} \left( 1 + \frac{R_P}{R_M} \right)$$

Figure 3:
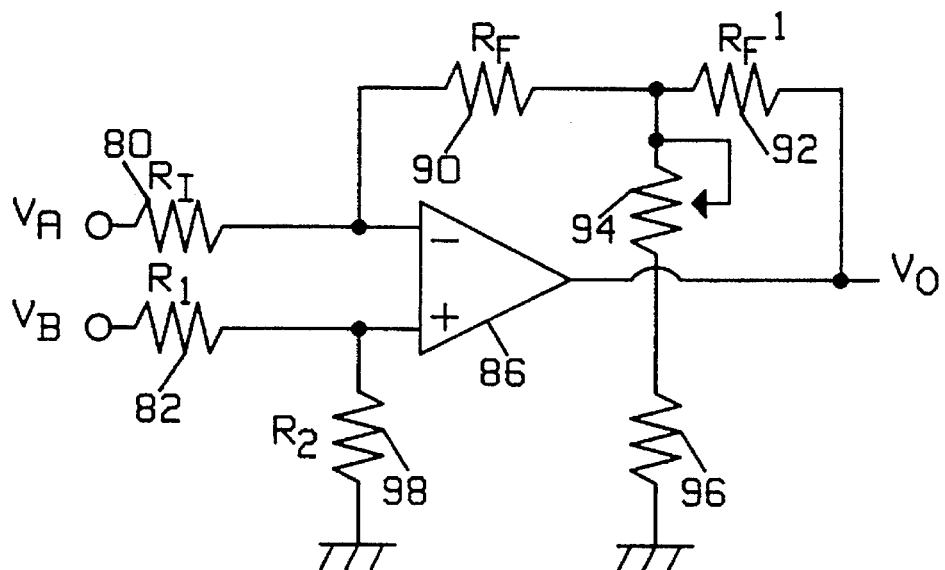
FIG. 3 is another example of a single amplifier differential input amplifier circuit with variable gain.
Figure 4:
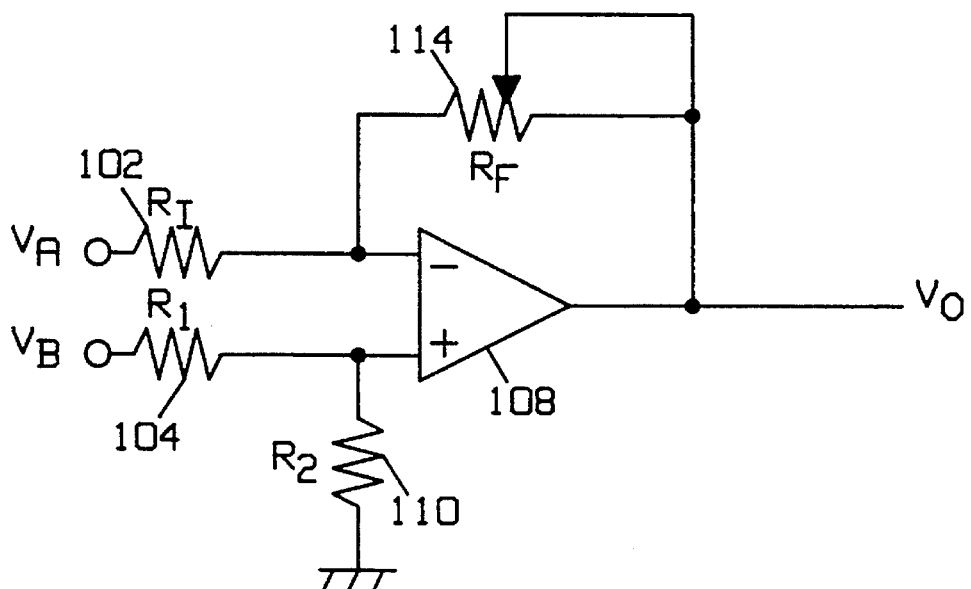
FIG. 4 is an amplifier circuit having differential input and variable gain using a single operational amplifier.

Under the above constraints, the following circuit values may be selected for an amplifier which provides gain in the range of approximately −12 db to +18 db:
$R_F$=6K Ω
$R_I$=24K Ω
$R_1$=8K Ω
$R_2$=2K Ω
$R_P+R_Q$=1K Ω linear Potentiometer
$R_M$=30Ω
$R_X$=100K Ω
C=22 pf With these component values, the differential amplifier has a common mode rejection ratio which varies with the adjustment of the potentiometer 134 but is generally in the range of approximately 40 dB. The differential input impedance of the present circuit is approximately 32K Ω ($R_1+R_I$). This is approximately half the value of the circuit of FIG. 3 to obtain the same minimum gain. Moreover, this circuit configuration provides a much lower minimum gain than that of the circuit of FIG. 3 while requiring the same number of components. If resistor 142 is omitted, a reduction in the number of components required can be achieved. In the preferred embodiment the amplifier 120 is selected to be an analog devices OP275, but those skilled in the art will recognize that a number of amplifiers may be suitable for this purpose.

The present invention provides a single amplifier stage having a widely adjustable range from approximately −12 dB to +18 dB while retaining an acceptably low input impedance and an acceptably high common mode rejection ratio.

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. A differential amplifier circuit with variable gain, comprising in combination:

an operational amplifier having an inverting input, a non-inverting input and an output;

a pair of input resistors $R_I$ and $R_1$ each having a first terminal respectively connected to said inverting input and said non-inverting input, and each having a second terminal for receiving a differential input signal;

a resistor $R_2$ connected from said non-inverting terminal to a point of AC ground;

a potentiometer having a wiper, a first end and a second end, said second end connected to said output for controlling a differential gain of said differential amplifier;

a resistor $R_M$ connected between said first end of said potentiometer and ground;

a resistor $R_F$ connected between said wiper of said potentiometer and said inverting terminal of said operational amplifier and a feedback compensation capacitor in parallel with $R_F$.

2. The amplifier of claim 1, further comprising a resistor $R_X$ connected from said wiper to said output.

3. The amplifier of claim 1, wherein said resistors $R_1$, $R_2$, $R_I$ and $R_F$ are related in value by:

$$\frac{R_F}{R_I} = \frac{R_2}{R_1}.$$

4. The amplifier of claim 2, wherein said resistors $R_1$, $R_2$, $R_I$ and $R_F$ are related in value by:

$$\frac{R_F}{R_I} = \frac{R_2}{R_1}.$$

5. The amplifier of claim 1, wherein a resistance value of $R_F$ is much greater than a value of $R_P$.

6. The amplifier of claim 2, wherein a resistance value of $R_F$ is much greater than a value of $R_P$.

7. The amplifier of claim 3, wherein a resistance value of $R_F$ is much greater than a value of $R_P$.

8. The amplifier of claim 2, wherein a resistance value of $R_X$ is much greater in value than a resistance value of said potentiometer.

9. The amplifier of claim 3, wherein a resistance value of $R_X$ is much greater in value than a resistance value of said potentiometer.

10. The amplifier of claim 1, wherein resistive values of said resistors $R_1$, $R_2$, $R_F$, $R_I$, $R_M$ and said potentiometer are selected to provide a range of differential voltage gain of approximately −12 db to +18 db.

11. The amplifier of claim 2, wherein resistive values of said resistors $R_1$, $R_2$, $R_F$, $R_I$, $R_M$ and said potentiometer are selected to provide a range of differential voltage gain of approximately −12 db to +18 db.

12. The amplifier of claim 3, wherein resistive values of said resistors $R_1$, $R_2$, $R_F$, $R_I$, $R_M$ and said potentiometer are selected to provide a range of differential voltage gain of approximately −12 db to +18 db.

13. A differential amplifier circuit with variable gain, comprising in combination:

an operational amplifier having an inverting input, a non-inverting input and an output;

a pair of input resistors $R_I$ and $R_1$ each having a first terminal respectively connected to said inverting input and said non-inverting input, and each having a second terminal for receiving a differential input signal;

a resistor $R_2$ connected from said non-inverting terminal to a point of AC ground;

a potentiometer having a wiper, a first end and a second end, said second end connected to said output for controlling a differential gain of said differential amplifier;

a resistor $R_M$ connected between said first end of said potentiometer and said point of AC ground;

a resistor $R_F$ connected between said wiper of said potentiometer and said inverting terminal of said operational amplifier;

a feedback compensation capacitor in parallel with $R_F$;

a resistor $R_X$ connected from said wiper to said output;

wherein a resistance value of $R_F$ is much greater than a value of $R_P$, a resistance value of $R_X$ is much greater in value than a resistance value of said potentiometer, and said resistors $R_1$, $R_2$, $R_I$ and $R_F$ are related in value by:

$$\frac{R_F}{R_I} = \frac{R_2}{R_1}$$

14. The amplifier of claim 13, wherein resistive values of said resistors $R_1$, $R_2$, $R_F$, $R_I$, $R_M$ and said potentiometer are selected to provide a range of differential voltage gain of approximately −12 db to +18 db.

15. A differential amplifier circuit with variable gain, comprising in combination:

an operational amplifier having an inverting input, a non-inverting input and an output;

a pair of input resistors $R_I$ and $R_1$ each having a first terminal respectively connected to said inverting input and said non-inverting input, and each having a second terminal for receiving a differential input signal;

a resistor $R_2$ connected from said non-inverting terminal to a point of AC ground;

a potentiometer having a wiper, a first end and a second end, said second end connected to said output for controlling a differential gain of said differential amplifier;

a resistor $R_M$ connected between said first end of said potentiometer and ground;

a resistor $R_F$ connected between said wiper of said potentiometer and said inverting terminal of said operational amplifier; and a feedback compensation capacitor in parallel with $R_F$.

16. A differential amplifier circuit with variable gain, comprising in combination:

an operational amplifier having an inverting input, a non-inverting input and an output;

a pair of input resistors $R_I$ and $R_1$ each having a first terminal respectively connected to said inverting input and said non-inverting input, and each having a second terminal for receiving a differential input signal;

a resistor $R_2$ connected from said non-inverting terminal to a point of AC ground;

a potentiometer having a wiper, a first end and a second end, said second end connected to said output for controlling a differential gain of said differential amplifier;

a resistor $R_M$ connected between said first end of said potentiometer and said point of AC ground;

a resistor $R_F$ connected between said wiper of said potentiometer and said inverting terminal of said operational amplifier;

a feedback compensation capacitor in parallel with $R_F$;

a resistor $R_X$ connected from said wiper to said output; and wherein a resistance value of $R_F$ is much greater than a value of $R_P$, a resistance value of $R_X$ is much greater in value than a resistance value of said potentiometer, and said resistors $R_1$, $R_2$, $R_I$ and $R_F$ are related in value by:

$$\frac{R_F}{R_I} = \frac{R_2}{R_1}$$

* * * * *